(12) United States Patent
Hüttenhofer (10) Patent No.: US 11,558,053 B2
(45) Date of Patent: Jan. 17, 2023

(54) CAPACITIVE SENSOR SWITCH WITH OPTICAL SENSOR

(71) Applicant: CAPTRON Electronic GmbH, Olching (DE)

(72) Inventor: Kilian Hüttenhofer, Munich (DE)

(73) Assignee: CAPTRON ELECTRONIC GmbH, Olching (DE)

( * ) Notice: Subject to any disclaimer, the term of this patent is extended or adjusted under 35 U.S.C. 154(b) by 0 days.

(21) Appl. No.: 17/544,022

(22) Filed: Dec. 7, 2021

(65) Prior Publication Data
US 2022/0190827 A1 Jun. 16, 2022

Related U.S. Application Data

(63) Continuation of application No. PCT/EP2020/064149, filed on May 20, 2020.

(30) Foreign Application Priority Data

Jun. 12, 2019 (EP) .................................. 19179762

(51) Int. Cl.
*H03K 17/96* (2006.01)
(52) U.S. Cl.
CPC ....... *H03K 17/9618* (2013.01); *H03K 17/962* (2013.01); *H03K 17/9627* (2013.01); *H03K 2017/9613* (2013.01)
(58) Field of Classification Search
None
See application file for complete search history.

(56) References Cited

U.S. PATENT DOCUMENTS

| 5,410,148 | A | * | 4/1995 | Barron, Jr. | ........... | H03K 17/962 |
|---|---|---|---|---|---|---|
| | | | | | | 250/221 |
| 8,823,393 | B2 | | 9/2014 | Aubauer et al. | | |
| 2007/0032967 | A1 | | 2/2007 | Feen et al. | | |
| 2010/0315337 | A1 | | 12/2010 | Ferren et al. | | |
| 2013/0062180 | A1 | | 3/2013 | Uenomachi et al. | | |
| 2013/0314365 | A1 | | 11/2013 | Woolley et al. | | |

FOREIGN PATENT DOCUMENTS

| EP | 2822181 A1 | 1/2015 |
|---|---|---|
| WO | 2018167074 A1 | 9/2018 |

OTHER PUBLICATIONS

PCT International Search Report and Written Opinion, PCT/EP2020/064149, dated Jul. 30, 2020, 15 pages.

* cited by examiner

*Primary Examiner* — Daniel C Puentes
(74) *Attorney, Agent, or Firm* — Quarles & Brady, LLP; Yakov S. Sidorin (57) ABSTRACT

A sensor switch with water suppression includes a sensor electrode and a photodiode connected to an evaluation circuit. The evaluation circuit generates a capacitive sensor signal indicative of an electrically-conductive object in the proximity of the sensor switch and an optical sensor signal indicative of an object at least partially opaque or impermeable to light in the proximity of the sensor switch. The capacitive sensor signal and the optical sensor signal are correlated with one another to generate an output signal.

14 Claims, 9 Drawing Sheets

CAPACITIVE SENSOR SWITCH WITH OPTICAL SENSOR

CROSS-REFERENCE TO RELATED APPLICATIONS

This application is a continuation of pending International Application No. PCT/EP2020/064149 filed on May 20, 2020 and now published as WO 2020/249371, which designates the United States and claims priority from European Application No. 19179762.0 filed on 12 Jun. 2019. The disclosure of each of these applications is incorporated by reference herein.

BACKGROUND

1. Field of the Invention

The invention relates to a capacitive sensor switch, also interchangeably referred as a sensor switch or a capacitive sensor button, which may be used to detect the proximity of an object or body part such as a hand to a sensing surface and a sensing and evaluation circuit thereof.

2. Description of Related Art

A touch sensitive switch for cook tops is disclosed in U.S. Pat. No. 8,823,393 B2. Here, an AC signal is coupled into a sensor plate. An evaluation circuit measures the amplitude of the signal. If a human hand or another electrically conductive object is placed into close proximity of the sensor plate, a capacitive current flows between the sensor plate and the hand, thus reducing the amplitude of the AC signal. The evaluation circuit may comprise a threshold detector and a window comparator to detect a certain change in amplitude and to issue a control signal at an output. A disadvantage is that an electrically conductive liquid, for example water, on the sensor surface may have the same effect. Accordingly, such a liquid may lead to a false triggering of the switch.

WO 2018/167074 A1 discloses a capacitive sensor switch with display. US 2007/032967 A1 discloses an automatic environmental compensation of capacitance based proximity sensor.

SUMMARY

Embodiments of the invention provide a capacitive proximity sensor establishing high immunity against false triggering through an electrically conductive liquid.

In an embodiment, a sensor switch includes a capacitive proximity sensor combined with an optical sensor and an evaluation electronic circuitry, referred to herein for simplicity as evaluation circuit. The capacitive proximity sensor includes a sensor conductor or sensor electrode, which normally may be a plate or foil of an electrically conductive material forming the active sensor surface. This electrode is preferably at or close to the bottom of a sensor switch housing. The electrode is connected to an evaluation circuit configured to evaluate and/or measure the capacitance with respect to ground. When an electrically conductive object, such as the hand of a person that is further in contact with ground (for example, a person standing on the floor) approaches the sensor electrode, the capacitance to ground increases. Instead or in addition to ground, a reference electrode—which may be integrated into the into the sensor switch—may serve as reference. The evaluation circuit itself has a capacitive or galvanic connection to ground, such that a change of capacitance can be detected when an electrically conductive object or a body part approaches the sensor electrode. This may for example be measured by applying an AC or RF signal in a medium frequency range, preferably between 10 kHz and 10 MHz, to the sensor electrode, while the voltage at the sensor electrode is measured. With increasing capacitance to ground, the voltage decreases. Here, the whole environment of the sensor switch may be considered as ground. If the evaluation circuit is sensitive enough, a very high impedance is sufficient to generate a detectable voltage drop and therefore a low capacitance between the ground reference of the evaluation circuit, which for example may be connected to the housing of the sensor switch to the ground and over the person.

The optical sensor of the sensor switch includes at least one photosensor. The photosensor may include at least one of a photodiode, a phototransistor, and an integrated circuit. (In the following disclosure, the terms photosensor and photodiode may be used interchangeably.) The at least one photodiode preferably is oriented to face in the direction of the active sensor surface and therefore towards the top of the sensor housing. In a normal state without any object touching the surface of the sensor, the photodiode will detect ambient light which may vary depending on the environmental conditions. Ambient light may for example be very bright sunlight on a sunny day, an artificial light in an industrial hall, or a very dim light during night. If a person, i.e. a body part of a person or an object that is at least partially opaque or even substantially impermeable to light touches the switch, the level of light reaching the optical sensor will be attenuated, and therefore a decrease of light can be detected. In the case of object being water, which has a certain conductivity and may attenuate the signal at the sensor electrode such that a capacitive sensor signal is detected, the photodiode will register substantially no attenuation or only a minor attenuation of ambient light.

To allow for a safe detection of a body part and to distinguish the presence of the body part over water, the signals of the sensor electrode and the photodiode have to be correlated and/or coincident. If the signal from the sensor electrode indicates a higher attenuation and—at the same time—the photodiode indicates a higher attenuation, it is reasonable to conclude with a very high probability that a body part has approached the sensor. In such a case a positive output signal may be generated which indicates or represents a positive detection. In the situation when there is only a capacitive sensor signal, but no optical signal, generated by the switch is indicative of probably water or another electrically conductive liquid being on the sensor, but no body part present next to or on the sensor. Therefore, such event may be ignored. In the case of changing signals at the photodiode but without an increasing attenuation indicated at or by the capacitive sensor, there is a high probability that there are only ambient light changes, but no body part is approaching the sensor. Therefore, this event should also be ignored.

In this embodiment, the only positive event to be detected is a decreasing light intensity and a decreasing signal level at the capacitive sensor.

In a related embodiment, there are multiple photodiodes present at the sensor switch, which are used for optical proximity detection. Depending on the size and the number of photodiodes, the size and the position of a light-absorbing object approaching the sensor surface of the switch may be estimated. Accordingly, events may be disregarded, if or when the object is too small or too large. Therefore, an electrically-conductive but light-absorbing liquid (such as a dark-colored water, for example) may also be detected, as in most cases it will be spilled over the whole surface of the switch and therefore cover a large number of photodiodes, if not even all photodiodes of the switch. If there is a significant number of photodiodes evenly distributed over the sensor surface of the switch, the size of the object being detected may be limited (such as in the situation when a finger covers a certain number of the overall photodiodes) and the event may be ignored if the number of photodiodes falls under a certain limit. Furthermore, an event may only be accepted if the positively detecting photodiodes have a certain spatial relationship, for example are close to each other as defined by specific chosen geometrical parameters. To the contrary, an event will be ignored if a number of photodiodes being distant from each other indicate a higher attenuation.

The switch may alternatively or additionally be configured to include certain sensitive and insensitive areas at the sensor surface, or certain areas which trigger certain events. For example, a two-pole sensor switch may be structured by grouping the photodiodes of one half of the switch into a first group and the photodiodes of the other half of the switch into a second group. In this case, if the first group of photodiodes detects an event, the first event is triggered, and if the second group of photodiodes detects an attenuation, the second event may be triggered. In another embodiment, a single photodiode may be used to optically identify a specific location on the switch. This may be one pole of a two pole switch.

In a further related embodiment, a dynamic threshold of either the capacitive sensor and/or the optical sensor of the sensor switch may be used. This may, for example, allow for detection of a finger approaching the sensor surface even if the surface of the sensor is covered with liquid (water, for example). In this case, the capacitive sensor signal further increases while the optical sensor signal also detects a higher optical attenuation.

In at least one embodiment, an evaluation circuit (electronic circuitry) may be provided configured to have a dynamic threshold to detect an increasing electrical load to the at least one sensor electrode coincident with a decreasing light level at the at least one photosensor. Alternatively or in addition, the evaluation circuit may be configured to generate an output signal dependent on an electrical load to the at least one sensor electrode.

In at least one embodiment, the evaluation circuit may be additionally or in the alternative configured to store a dynamic threshold value based on the capacitive sensor signal when the optical sensor signal exceeds a predetermined threshold value. It may further be configured to generate an output signal when the capacitive sensor signal exceeds the dynamic threshold value.

The dynamic threshold value may be chosen to be larger than the capacitive sensor signal.

In an embodiment, the evaluation circuit may be configured to store a dynamic threshold value based on the optical sensor signal when the capacitive sensor signal exceeds a predetermined threshold value. It may further be configured to generate an output signal when the optical sensor signal exceeds the dynamic threshold value.

The dynamic threshold value may be chosen to be larger than the optical sensor signal.

In at least one case, the dynamic threshold value may be derived from a sensor signal by multiplying the signal with a constant factor and/or adding a constant offset. In another embodiment, at least one sensor electrode is configured to be planar and at least one photosensor of the switch is disposed in the area of the at least one sensor electrode. There may be a chosen distance between the sensor electrode and the photosensor of less than half of the maximum extension of the sensor electrode, for example The distance may be less than 50 mm, less than 20 mm or less than 10 mm, depending on specifics of the particular implementation. The sensor electrode(s) and the photosensor(s) may be in a common plane or in planes distant of less than 10 mm, less than 5 mm or less than 2 mm, depending on the specifics of the particular implementation.

In yet another related embodiment, at least one light-emitting diode (LED) is provided. The LED may either be configured, in operation, to signal or indicate special states of the sensor switch (the switch states), to illuminate the switch and/or to provide light to be detected by the photodiode. For signaling and illumination purposes, the LED may be switched off when the ambient light level is measured by a photodiode of the sensor switch. If the LED is used for measurement purposes, it may be configured to be "on" at the same time when the signal is measured from (generated by) at least one photodiode of the sensor switch. There may be at least one or multiple pairs of LEDs and photodiodes—in which case the group of LEDs and the group of photodiodes are preferably are optically isolated from each other.

In an embodiment, the AC or RF signal may be in the frequency range of a few kHz to 5 MHz. The waveform of the signal may have a rectangular or a sinusoidal shape, and preferably such signal is a spread spectrum signal. Such a spread spectrum signal may be a sequential signal providing a pseudo noise sequence. For different electrodes, different noise sequences may be used. This avoids any interference between neighboring electrodes.

In a further embodiment, the sensor circuitry may be completely or at least in part implemented in a microcontroller. This provides lower cost and higher flexibility. A further embodiment relates to a method of detecting a light-absorbing object on a capacitive sensor surface by detecting incoming light to the sensor surface (preferably by photodiodes) and correlating the detected light signal from the optical sensor with the capacitive sensor signal.

BRIEF DESCRIPTION OF THE DRAWINGS

In the following, embodiments of the invention will be described by way of example, without limitation of the general inventive concept, on examples of embodiment and with reference to the drawings, of which.

Generally, the drawings are not to scale. Like elements and components are referred to by like labels and numerals. For the simplicity of illustrations, not all elements and components depicted and labeled in one drawing are necessarily labels in another drawing even if these elements and components appear in such other drawing.

While various modifications and alternative forms of implementation of the idea of the invention are within the scope of the invention, specific embodiments thereof are shown by way of example in the drawings and are described below in detail. It should be understood, however, that the drawings and related detailed description are not intended to limit the implementation of the idea of the invention to the particular form disclosed in this application, but to the contrary, the scope of the intention is to cover all modifications, equivalents and alternatives falling within the spirit and scope of the present invention as defined by the appended claims.

DETAILED DESCRIPTION

Figure 1:
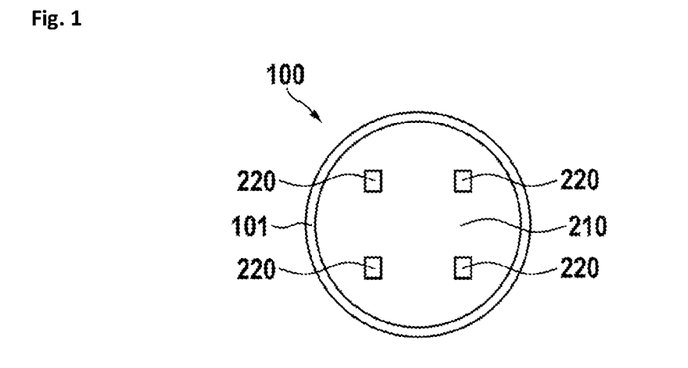
FIG. 1 is a top view on a sensor switch.

In FIG. 1, a top view on a sensor switch 100 is shown. The sensor switch 100 has a housing 101 and a printed circuit board 210 bearing electrical components, such as a sensor electrode 162 and at least one of the photodiode 220. The printed circuit board 210 may also hold the evaluation circuit 150 (shown explicitly in FIG. 16).

Figure 2:
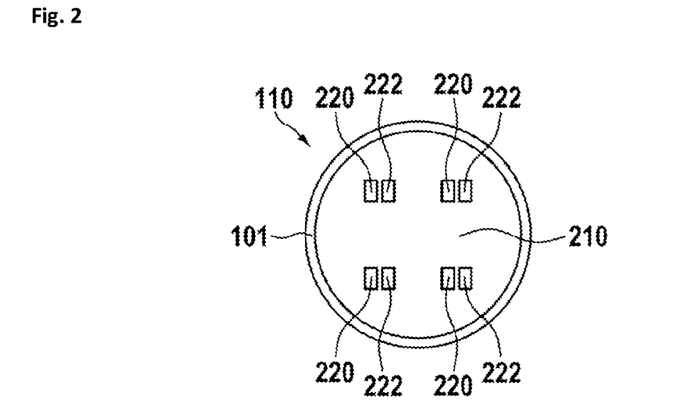
FIG. 2 shows a further embodiment with grouped photodiodes and LEDs.

FIG. 2 illustrates a further embodiment of a sensor switch 110 with grouped photodiodes and LEDs. Close to (in proximity of) at least one of the photodiodes 220, at least one LED 222 is arranged. These LEDs may be used for indicating some operating states of the switch to a person or an operator of the switch. The LEDs may also be used to illuminate the switch itself, such that the switch may be easier recognized during night or may have a better appearance. Finally, the LEDs may be used to produce light which may be detected by the photodiodes of the switch to detect a presence of a body part at the switch. This light may be used if the ambient light is not sufficient for the detection of the object. If the LEDs are only used for indication purposes or for illuminating the switch, the LEDs may be time-multiplexed, such that during measurement intervals when the photodiodes are measuring the ambient light for detecting a body part, the LEDs are "off". If the LEDs are used for detecting a body part, they must be "on" during measurement intervals of the photodiode(s). The LEDs may be grouped with photodiodes or arranged otherwise. Groups of LEDs and/or photodiodes may preferably be optically insulated from each other to avoid cross coupling of light. The optical insulation may also be achieved and/or improved by alternatingly switching "on" and "off" such groups of LEDs and/or photodiodes.

Figure 3:
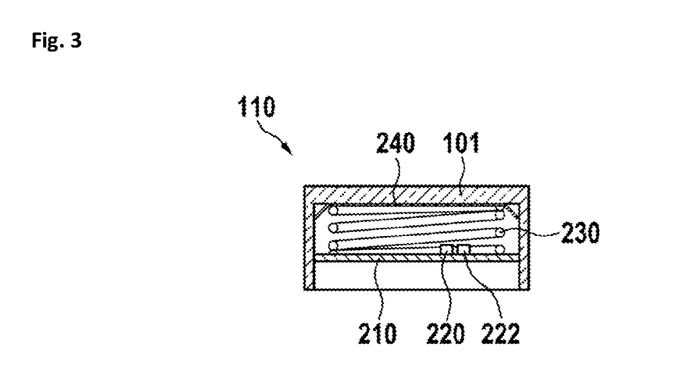
FIG. 3 is a sectional side view.

In FIG. 3, a sectional side view of an embodiments of the sensor switch is shown. The housing preferably has a cup shape for holding the circuit components. Preferably, the housing includes a clear material, such as glass, acrylic or PMMA. It may also include any translucent material and/or a spectral filter. The components of the sensor switch may include a printed circuit board 210 holding at least a photodiode 220 and at least one LED 222, which may be optional. Close to the top of the housing 101, there may be formed a light-diffusing film 240 which disperses the light entering and leaving the clear (optically transmissive) housing. This results in an optically smooth surface of the switch. In one specific case, the diffusing film may be held in place by a spring 230.

Figure 4:
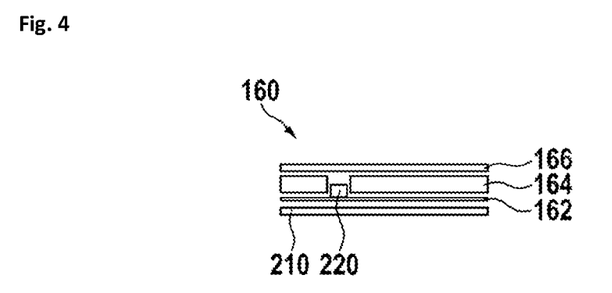
FIG. 4 is a sectional view of a sensor assembly.

In FIG. 4, a sectional view of a sensor assembly 160 is shown. At the bottom a printed circuit board 210 is located configured as a mechanical support for the sensor assembly. On the printed circuit board 210, there may be at least a photodiode 220 and at least one optional LED. In addition, there is a sensor electrode which may be a discrete layer that may be a solid layer, a partially solid layer, configured as a mesh, as a ring or as multiple lines or stripes of material. Alternatively, there may be separate foil or mesh on the printed circuit board. Above the sensor electrode 162 there is a spacer 164 of a dielectric or electrically conductive material. Preferably the spacer has recesses above the photodiodes, such that light may penetrate the spacer. If the spacer is of a light-conducting material, there may be no recesses. On top of the spacer a light-diffusing film 166 may be placed. The assembly 160 of this specific example may be disposed within a cup-shaped housing similar to that shown in FIG. 3 as housing 101.

Figure 5:
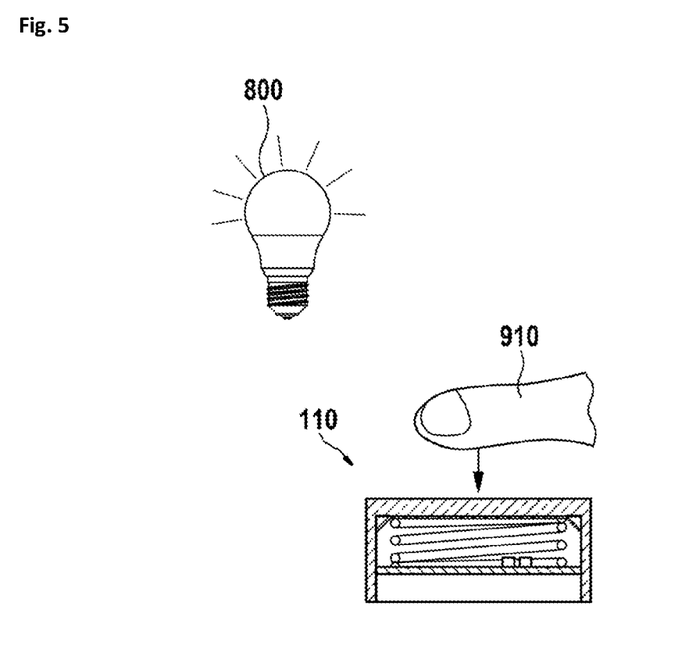
FIG. 5 shows the basic function.

FIG. 5 illustrates the basic operational function of an embodiment of the invention. As shown, a light source 800 generates ambient light. The light source may be the Sun, a lamp, an LED, or any other suitable light source. The light irradiates the sensor switch 110 and parts of this light may be absorbed by a body part, such as a finger 910, that is located next to the sensor switch 110 and is at least partially (not completely) opaque or even impermeable to light.

Figure 6:
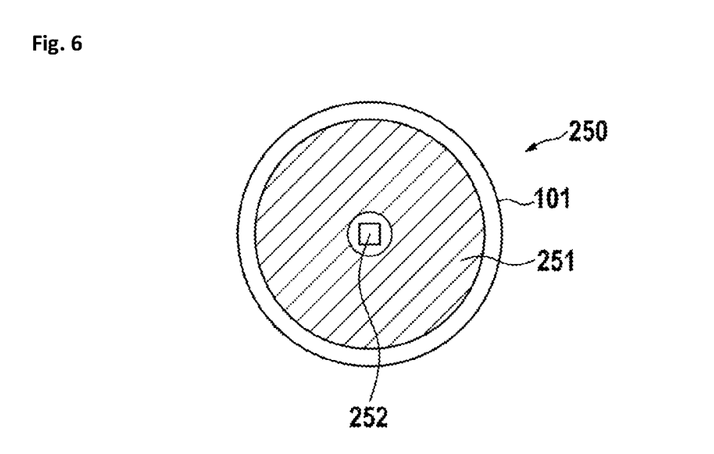
FIG. 6 shows a cylindrical embodiment.

In FIG. 6, a cylindrical embodiment is shown in a top view of a sensor switch 250. The housing 101, which may have a cylindrical shape, holds a circular sensor electrode 251 that has a cut-out, preferably at the center of the electrode (as shown). A photosensor 252 is located at or in the area of this cutout. The cut-out with the photosensor may also be formed at substantially any other location across the electrode 252. There may also be multiple photosensors. There may be at least one LED for providing light to the photosensor. This embodiment is very simple, robust and can easily be manufactured.

Figure 7:
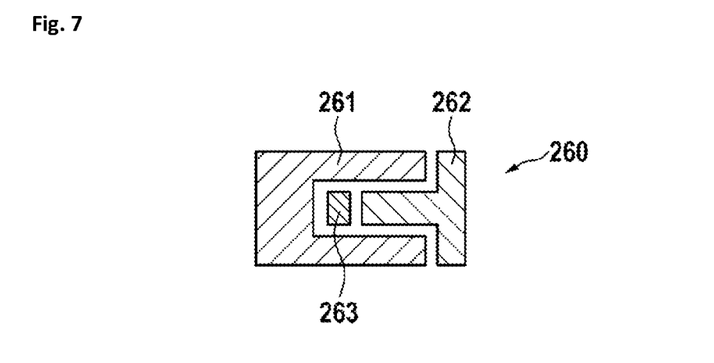
FIG. 7 shows a first interleaved sensor embodiment.

In FIG. 7 a first interleaved sensor embodiment is shown in a top view of a sensor switch 260. A first sensor electrode 261 and a second sensor electrode 262 are shown spatially interleaved, where the first sensor electrode 261 has a U-shape and the second sensor electrode 262 has a T-shape dimensioned such that the base bar of the T-shaped electrode 262 fits into the opening of the U-shaped electrode 261. Any of these two electrodes may be configured to have the (active) sensor surface, while the other of these two electrode may serve as reference or ground. Between the electrodes 261, 262 there is a photosensor 263. This sensor offers a higher sensitivity and may be dimensioned to cover a larger surface than the sensor with a circular electrode.

Figure 8:
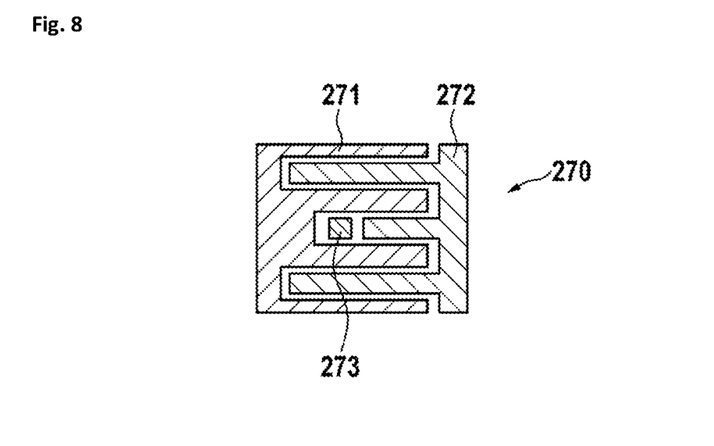
FIG. 8 shows a second interleaved sensor embodiment.

In FIG. 8 a second interleaved sensor embodiment is shown in a top view of a sensor switch 270. Here, a first sensor electrode 271 and a second sensor electrode 272 are arranged interleaved. The second sensor electrode 272 has multiple fingers that fit into grooves of the first sensor electrode 271. Any of these electrodes may be configured to have the (active) sensor surface, while the other of the electrodes may serve as reference or ground. Between the electrodes 271, 272 there is a photosensor 263. This sensor offers a much higher sensitivity and may cover a significantly larger surface than the sensor with a circular electrode. There may also be a larger number of fingers and grooves.

Any of the above embodiments may contain multiple photosensors. There may be at least one LED for providing light to the photosensor.

Figure 9:
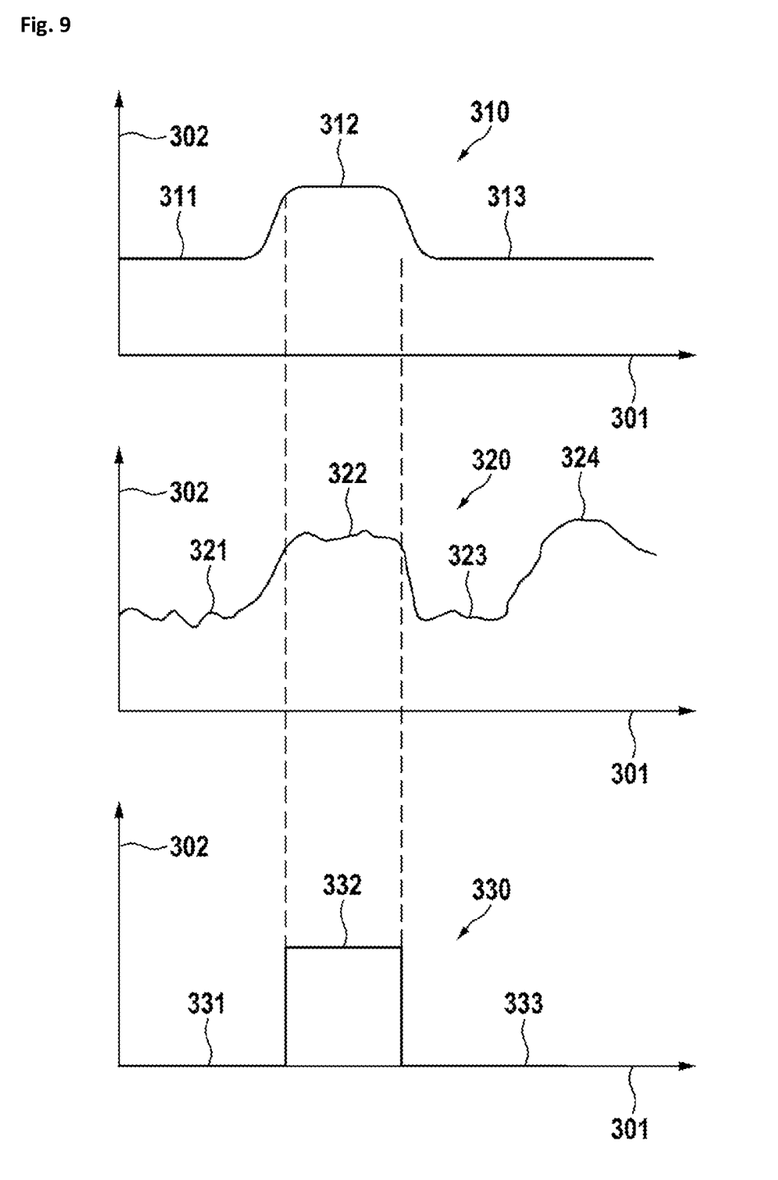
FIG. 9 shows diagrams of the capacitive and optical signals.

FIG. 9 provides diagrams representing examples of the capacitive and optical signals associated with the operation of an embodiment of the sensor switch of the invention.

The first diagram 310 shows the capacitive sensor signal, whereas a higher attenuation generates a higher signal value. Therefore, in general, an electrically conductive object or body part approaching the sensor electrode will lead to an increase in signal voltage. The signal is shown along a time axis 301 to the right and along a voltage axis 302 to the top, with increasing time to the right and increasing voltage to the top.

The second diagram 320 shows the optical sensor signal resulting from attenuation of light by an object. A lower attenuation of light and therefore a higher light level results in a lower voltage, whereas a higher attenuation of light and therefore a lower light level results in a higher voltage. Therefore, in general, a light-absorbing object or body part approaching the sensor electrode will lead to an increase in signal voltage.

The third diagram 330 shows the output signal of the switch.

In the example of FIG. 9, when starting at the time axis 301 from the left to the right, first the sensor is not obstructed (that is, clear of everything) such that there is no body part or any other object in proximity to the sensor and at least a moderate amount of ambient light is available. Under these conditions, the embodiment of the sensor produces a capacitive sensor signal 311, an optical sensor signal 321, and an output signal 331 (which is zero), thereby indicating that no body part is detected. When, for example, a finger is brought into close proximity of the switch, the so-caused attenuation of the capacitive sensor increases resulting in a higher capacitive sensor signal 312. At the same time, the optical attenuation increases (due to blocking of ambient light with the finger), further resulting in a higher optical sensor signal 322. As described before, if there is a positive capacitive detection and a positive optical detection, the output signal will also be positive, resulting in output signal 332. Next, the finger is released (removed from the sensor switch), which results again in a capacitive sensor signal 313 similar to the initial capacitive sensor signal 311. Also the optical signal 323 falls back to a level similar to that of the initial optical sensor signal 321 and, accordingly, the output signal 33 goes to substantially zero, indicating that there is no body part in proximity to the switch. It is noted that the optical sensor signal has some ripple on the curve, as the ambient light may change due to various effects in the space around the sensor, such as persons moving around in a distance of one or a few meters, or deviations or changes of the light source. There may also occur stronger changes in light such as the peak 324 caused by an optical distortion of some light-absorbing object being between the light source and the switch, but without coming into close proximity of the switch. Therefore, the capacitive sensor signal 313 remains in a low state and as a result the output signal also remains in a low state 333, indicating that no body part was in close proximity to the switch.

In another case, which is not shown here, there may be water present on the sensor. Then there may be a higher capacitive sensor signal due to the conductivity of water, but the optical sensor signal would remain low due to the optical transmissibility of water. Accordingly, the output signal would be zero.

Figure 10:
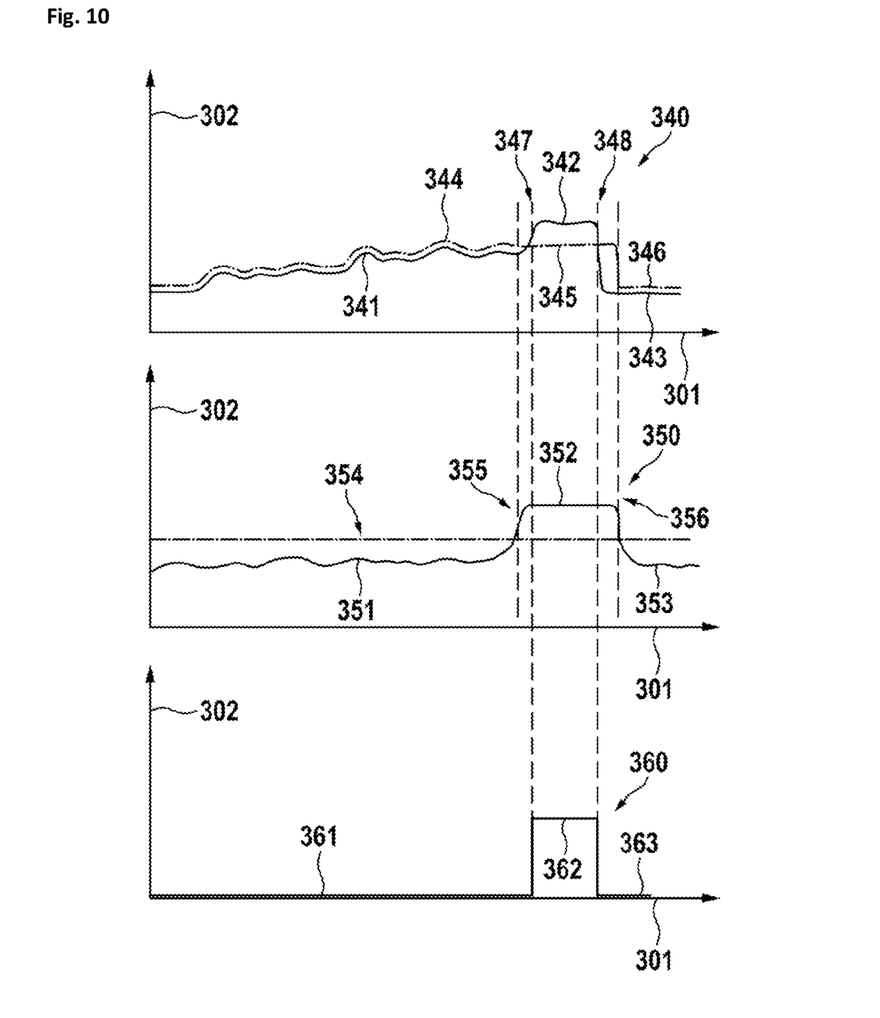
FIG. 10 shows diagrams of the signals with dynamic threshold.

FIG. 10 shows diagrams of the signals with an embodiment containing a dynamic threshold circuit. In this embodiment, the photosensor is used to define a sampling time of a dynamic threshold for the capacitive sensor. The signals are similar to the previous figure, but now there is a dynamic threshold for the capacitive sensor signals. The first diagram shows the capacitive sensor signal 340. The second diagram shows the optical sensor signal 350. The third diagram shows the output signal 360.

First, the waveform of the capacitive sensor signal 340 is described. Before a finger contact with the embodiment of the switch, a dynamic threshold 344 is generated from the capacitive sensor signal 341. Preferably, the threshold value is an offset or a proportion of the sensor signal (or both) above the sensor signal. When—as will be explained later—the optical sensor signal 352 exceeds the threshold 354 at time 355, a hold signal may be issued, the dynamic threshold 344 will be stored at a stored threshold value 345. Alternatively, the capacitive sensor signal 341 may be stored and a threshold value may be calculated thereof. When a finger further approaches the sensor, the capacitive sensor signal may further increase to sensor signal 342. When this sensor signal 342 increases above the stored threshold value at time 347, an output signal 362 is generated until the sensor signal 342 falls below the stored threshold value at time 348. When, at a later time, the optical sensor signal after finger contact is a lower signal 353 falls below threshold 354, holding of the threshold is released and the dynamic threshold 346 tracks the capacitive sensor signal after finger contact 343 again. In an embodiment, output signal 362 is solely dependent on sensor signal 342 staying above stored threshold value 345. The optical sensor signal 352 may fall below threshold 354 without affecting output signal 362. In another embodiment, output signal 362 may be set to zero, when the optical sensor signal 352 falls below threshold 354.

Now, in reference to the waveform of the optical sensor signal 350 of FIG. 10. Before a finger contact, the optical sensor signal 351 normally is below a threshold 354 that is a static optical sensor threshold. When a finger, a body part, or another object approaches the embodiment of the sensor, the signal increases to a level of the optical sensor signal 352 with finger contact, which may exceed the threshold 354. When the optical sensor signal 352 exceeds the threshold 354 at time 355, a hold signal may be issued and the dynamic threshold 344 will be stored. When the object departs from the sensor switch, optical sensor signal 352 becomes a lower signal 353 and falls below the threshold 354 at time 356. Then the dynamic threshold 344 will be released such that it tracks the capacitive sensor signal.

Finally the output signal 360 is described. Before and after finger contact, the signal is at low levels 361, 363. During a finger contact, when the sensor signal 342 is above the stored threshold value 345, coincident with an optical sensor signal 352 being at least for a time above threshold 354, the output signal 362 is at a high level.

An above-described embodiment of the device and a procedure of operating such an embodiment provide a high immunity against false alarms. Implementations of the idea of the invention are based on realization that, that normally, the presence of an object is detected earlier by the photosensor than by the capacitive sensor. Therefore, the photosensor is used to define a threshold for the capacitive sensor.

In an embodiment, the functions of the capacitive and the optical sensor may be exchanged, such that a first (upper) curve of FIG. 10 relates to an optical sensor signal 340 and a second curve of FIG. 10 relates to a capacitive sensor signal 350.

Figure 11:
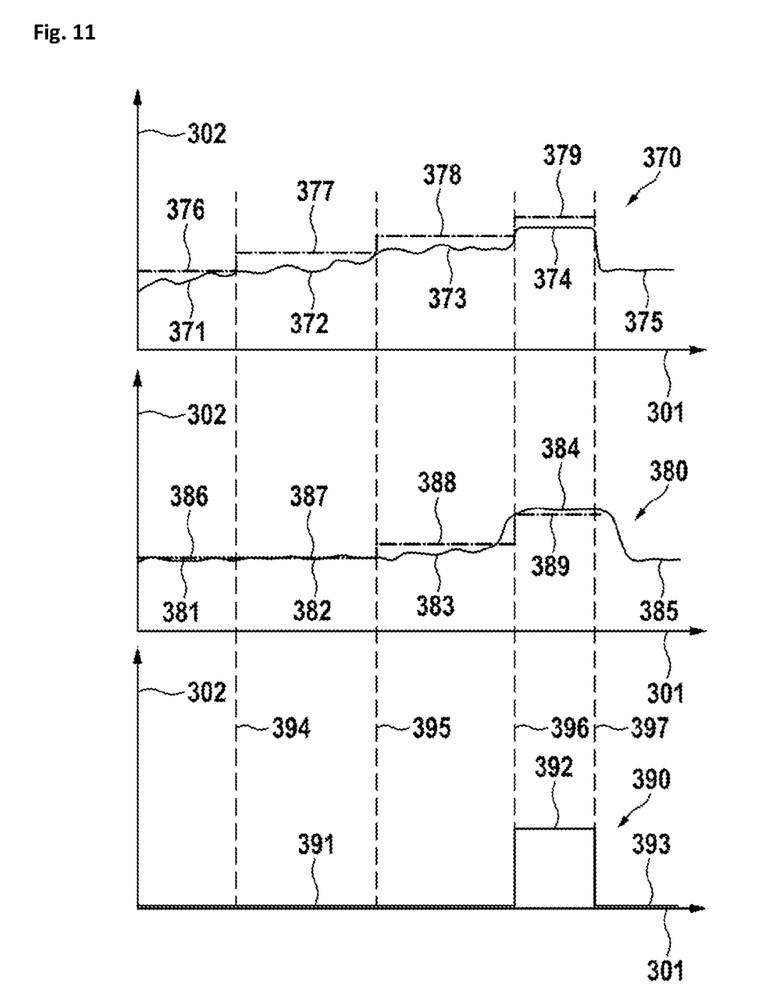
FIG. 11 shows diagrams of the signals with double dynamic threshold.

FIG. 11 shows diagrams of the signals produced with an embodiment containing a double dynamic threshold circuit. In this embodiment, the signal of the photosensor is correlated with the capacitive sensor. The signals are similar to the previous figures, but now there are dynamic thresholds for both sensor signals. The first diagram shows the capacitive sensor signal 370. The second diagram shows the optical sensor signal 380. The third diagram shows the output signal 390.

First, the capacitive sensor signal 370 is described. The capacitive sensor signals (first capacitive sensor signal 371, second capacitive sensor signal 372, third capacitive sensor signal 373, fourth capacitive sensor signal 374 and fifth capacitive sensor signal 375) are compared with dynamic thresholds (first capacitive sensor threshold 376, second capacitive sensor threshold 377, third capacitive sensor threshold 378 and fourth capacitive sensor threshold 379). Whenever a sensor signal exceeds a dynamic threshold, a sampling signal (first sampling signal 394, second sampling signal 395, third sampling signal 396 and fourth sampling signal 397) may be generated. Such a sampling signal may also be generated if a sensor signal goes below a dynamic threshold for a predetermined amount. Upon such a sampling signal, a new threshold is generated by increasing or decreasing the threshold, for example as described in the embodiment above. Here, the fourth capacitive sensor signal 374 is generated by a finger or other detectable object approaching the sensor.

Now, the optical sensor signal 380 is described in more detail. The optical sensor provides optical sensor signals (first optical sensor signal 381, second optical sensor signal 382, third optical sensor signal 383, fourth optical sensor signal 384 and fifth optical sensor signal 385), wherein the fourth optical sensor signal 384, having a level higher than the other sensor signals before and after this, is caused by approaching of a finger or another detectable object. Each time, a sampling signal is generated, a new threshold (first optical sensor threshold 386, second optical sensor threshold 387, third optical sensor threshold 388, and fourth optical sensor threshold 389) is generated based on the sensor signal by increasing or decreasing the sensor signal, for example as described in the embodiment above. In a further embodiment, the threshold may be the average value of the optical sensor signals during the past, for example for a predetermined period or since the last sampling signal. Furthermore, when a sampling signal is generated, the value of the optical sensor signal is compared to the threshold before generating a new threshold. If the optical sensor signal exceeds the threshold for a predetermined amount, an output signal with a high level 392 is generated.

Finally the output signal 390 is described. Before and after finger contact, the signal is at low levels 391, 393. During a finger contact, when the fourth capacitive sensor signal 374 generated the third sampling signal 396 and the fourth optical sensor signal 384 exceeds the fourth optical sensor threshold 389 for a predetermined amount, the output signal is at a high level 392.

An above-described embodiment of the device and a procedure of using such an embodiment as described above provide an improved immunity against false alarms. It is based on the fact, that normally, the presence of an object is detected earlier by the photosensor than by the capacitive sensor. Therefore, the photosensor is used to define a threshold for the capacitive sensor.

In a specific embodiment, the functions of the capacitive and the optical sensor may be exchanged, such that an upper curve 370 of FIG. 11 relates to an optical sensor signal and another curve 380 relates to a capacitive sensor signal.

Figure 12:
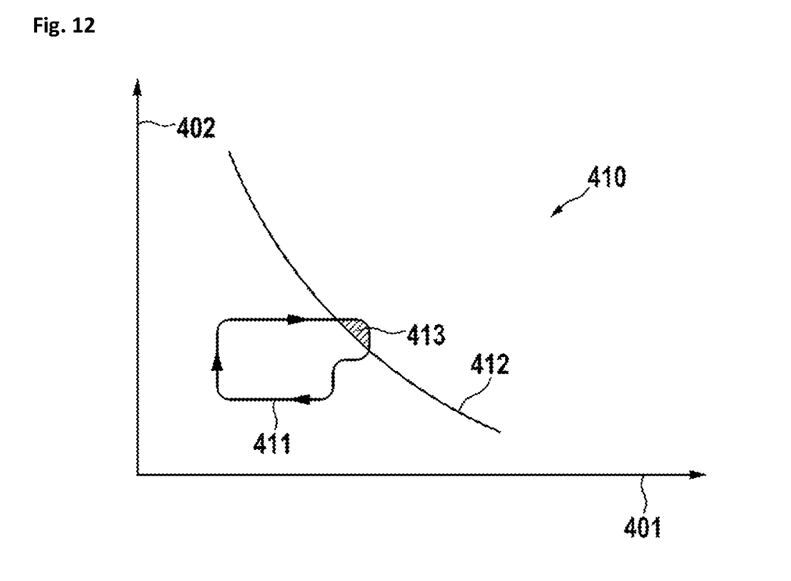
FIG. 12 shows another evaluation system.

FIG. 12 illustrates another evaluation system. The diagram 410 shows the capacitive and optical sensor signals, whereas a higher attenuation generates a higher signal value. The capacitive sensor value is noted along the horizontal axis 401, while the optical sensor value is depicted along the vertical axis 402. In a sample case, the curve may start in the left bottom corner with low values of capacitive and optical sensors. When—by approaching of a finger or other detectable device to the embodiment of the sensor—the value of the optical sensor value increases first, the curve moves upward in the diagram. Later, the capacitive sensor value may increase, which results in the curve moving to the right of the diagram. When the values exceed a predetermined limit curve 412 as shown by the positive detection area 413, a high or positive output signal is generated. When the object is removed, the curve returns to the left bottom corner as starting position. In an alternative embodiment, a third axis, representing the time may be used. This may result in a dynamic switching characteristic.

Figure 13:
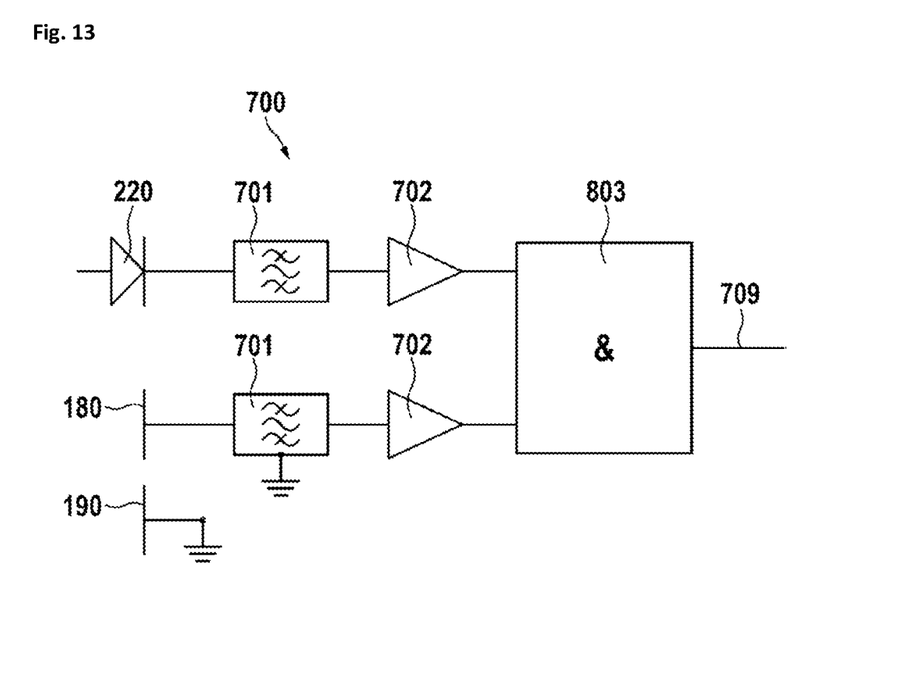
FIG. 13 shows a simple evaluation circuit.

In FIG. 13, a simple embodiment 700 of the evaluation circuit is shown. The embodiment has two inputs. A first input includes a photodiode 220, which is shown here only symbolically. Further required circuitry, such as a biasing circuit and/or amplifier is not explicitly shown. At the second input there is a sensor electrode 180, which preferably is a sensor electrode as previously shown. It is shown only symbolically here. Further required circuitry, such as a signal generator circuit and/or amplifier and/or detecting means are not explicitly illustrated. By approaching a body part to the sensor, the circuitry is bridged with a comparatively high impedance to ground to which also the sensor circuit refers.

The signal of the photodiode 220 and of the sensor electrode 180 are filtered by a bandpass filter 701 each to remove unwanted noise and distortions. Although both bandpass filter have the same reference numbers, they may have different bandpass characteristics adapted to the photodiode signal path or the capacitive signal path. After the bandpass filter 701, there may be threshold detector 702 to distinguish whether the input signal is above or below a threshold level. The output signals of the threshold detectors are coupled by an and gate 703 which generates a positive output signal 709 only if there is a positive capacitive detection and a positive photo detection.

Figure 14:
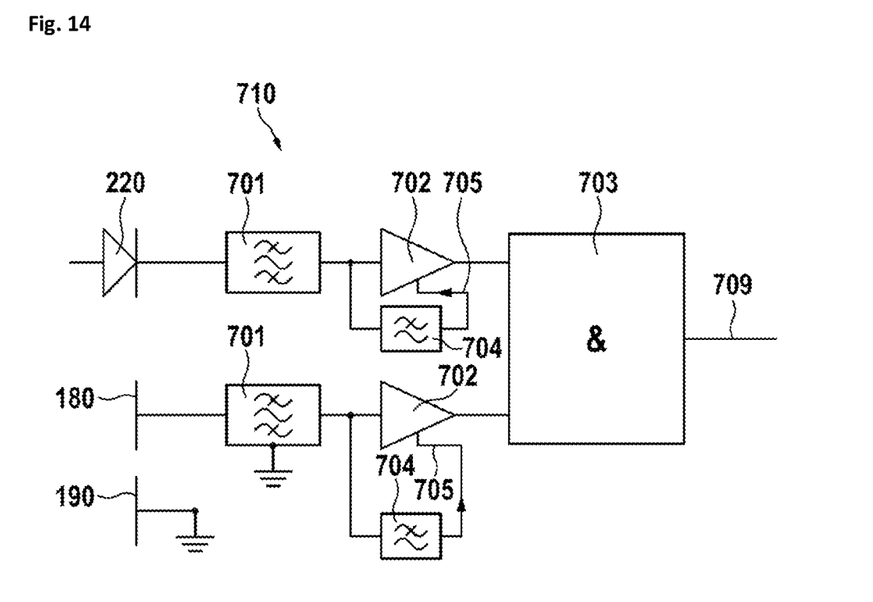
FIG. 14 shows a more complex evaluation circuit.

In FIG. 14, an embodiment of another, more complex evaluation circuit is shown. It is based on the circuit of FIG. 13. Here, a low pass filter 704 is added to each threshold detector 702. The low pass filter 704 generates a threshold signal 705 for the threshold detectors and therefore provides a dynamic switching threshold. This gives the circuit a significantly higher dynamic range which is especially useful for varying ambient light conditions. Therefore, it may be sufficient to implement such a low pass filter only at the light detection path coupled to the photodiode 220. This dynamic threshold allows a reliable distinction between an electrically conductive liquid or a body part such as a finger. Even a sensor with a liquid being distributed over the whole sensor surface may detect a finger, as the liquid simply shifts the threshold to a somewhat higher level. The finger will further increase the signal level, which may now be detected by such a dynamic threshold circuit. In an embodiment, this circuit may be operated as described in FIG. 10.

Figure 15:
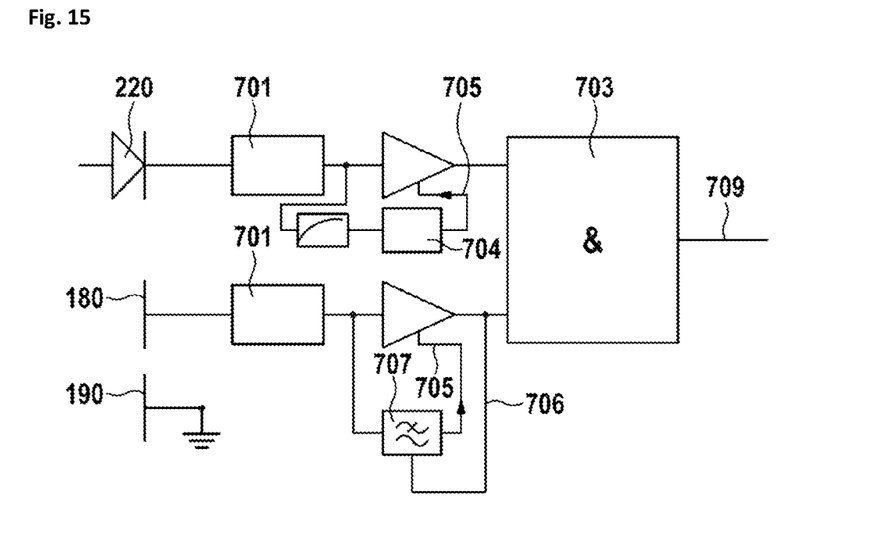
FIG. 15 shows an even more complex circuit.

In FIG. 15, a third, more complex embodiment of the evaluation circuit is shown. This evaluation circuit is based on the evaluation circuit of the previous FIG. 14. In this circuit, a dynamic threshold control 706 is provided. In an embodiment, this circuit may be operated as described in reference to FIG. 11.

Figure 16:
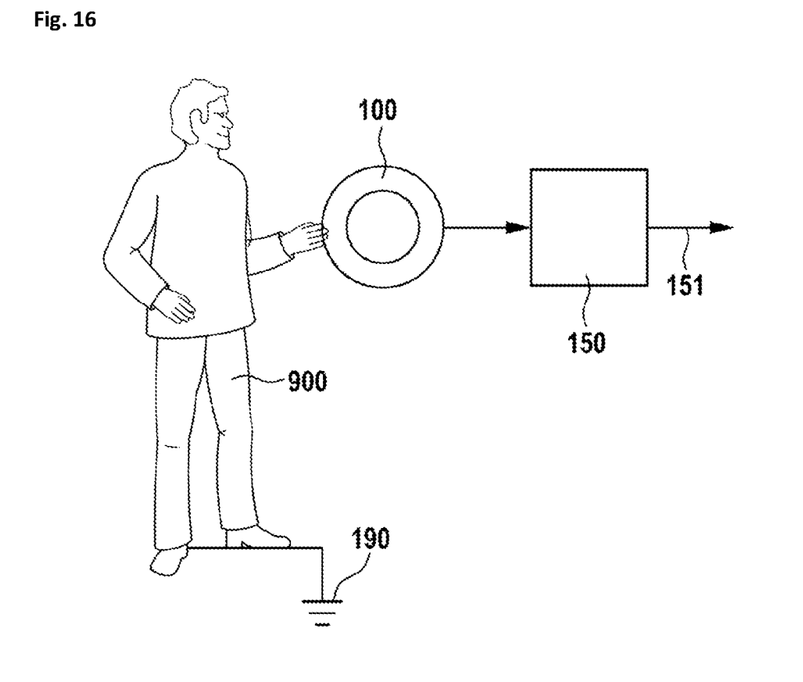
FIG. 16 shows the basic function of the sensor.

FIG. 16 illustrates the basic function of an embodiment of the sensor. As shown, a person 900, standing on a floor (electrical ground 190) touches the sensor switch 100. The signal produced by the sensor switch 100 is evaluated by an evaluation circuit 150, which then generates a correlated output signal 151 representing that the object (in this example—a hand of the person) in the proximity of the sensor is at least partially (that is, not completely) opaque or even substantially impermeable to ambient light. The evaluation circuit 150 is referred by its housing and the environment back to the ground 190, as where the person is. In an alternate embodiment, the signals may be referenced to a ground electrode at or of the sensor switch 100 instead of the ground 190.

It will be appreciated to those skilled in the art having the benefit of this disclosure that this invention is believed to provide a capacitive sensor switch. Further modifications and alternative embodiments of various aspects of the invention will be apparent to those skilled in the art in view of this description. Accordingly, this description is to be construed as illustrative only and is provided for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

LIST OF REFERENCE NUMERALS

100 sensor switch
101 housing
110 sensor switch
150 evaluation circuit
151 output signal
160 sensor assembly
162 sensor electrode
164 spacer
166 diffusing film
180 sensor electrode
190 ground
210 printed circuit board
220 photodiode
222 LED
230 spring
240 diffusing film
250 cylindrical sensor switch
251 sensor electrode
252 photosensor
260 interleaved sensor switch
261 first sensor electrode
262 second sensor electrode
263 photosensor
270 second interleaved sensor switch
271 first sensor electrode
272 second sensor electrode
273 photosensor
301 time axis
302 voltage axis
310 capacitive sensor signal
311 capacitive sensor signal before finger contact
312 capacitive sensor signal with finger contact
313 capacitive sensor signal after finger contact
320 optical sensor signal
321 optical sensor signal before finger contact
322 optical sensor signal with finger contact
323 optical sensor signal after finger contact
324 optical sensor signal with optical distortion
330 output signal
331 output signal before finger contact
332 output signal with finger contact
333 output signal after finger contact
340 capacitive sensor signal
341 capacitive sensor signal before finger contact
342 capacitive sensor signal with finger contact
343 capacitive sensor signal after finger contact
344 dynamic threshold before finger contact
345 stored threshold
346 dynamic threshold
347 time of capacitive sensor signal exceeding threshold
348 time of capacitive sensor signal falling below threshold
350 optical sensor signal
351 optical sensor signal before finger contact
352 optical sensor signal with finger contact
353 optical sensor signal after finger contact
354 static optical sensor threshold
355 time of optical sensor signal exceeding threshold
356 time of optical sensor signal falling below threshold
360 output signal
361 output signal before finger contact
362 high level output signal with finger contact
363 output signal after finger contact
370 capacitive sensor signal
371 first capacitive sensor signal
372 second capacitive sensor signal
373 third capacitive sensor signal
374 fourth capacitive sensor signal
375 fifth capacitive sensor signal
376 first capacitive sensor threshold
377 second capacitive sensor threshold
378 third capacitive sensor threshold
379 fourth capacitive sensor threshold
380 optical sensor signal
381 first optical sensor signal
382 second optical sensor signal
383 third optical sensor signal
384 fourth optical sensor signal
385 fifth optical sensor signal
386 first optical sensor threshold
387 second optical sensor threshold
388 third optical sensor threshold
389 fourth optical sensor threshold
390 output signal
391 output signal before finger contact
392 high level output signal with finger contact
393 output signal after finger contact
394 first sampling signal
395 second sampling signal
396 third sampling signal
397 fourth sampling signal
401 capacitive sensor value
402 photosensor value
410 sensor value diagram
411 curve of sensor values
412 limit curve 413 positive detection area
700 first evaluation circuit
701 bandpass filter
702 threshold detector
703 and gate
704 lowpass filter
705 threshold signal
706 dynamic threshold control
709 output signal
710 second evaluation circuit
800 light source
900 person
910 finger

The invention claimed is:

1. A sensor switch comprising at least one sensor electrode, at least one photosensor, and an evaluation circuit connected to both the at least one sensor electrode and the at least one photosensor,
wherein the evaluation circuit is configured to:
generate a capacitive sensor signal indicative of an electrically-conductive object that is present in a proximity of the sensor switch,
generate an optical sensor signal indicative of an object that is at least partially opaque to light and that is present in the proximity of the sensor switch,
generate a correlated output signal from the capacitive sensor signal and the optical sensor signal, the correlated output signal representing that the electrically-conductive object that is at least partially opaque to light is in the proximity of the sensor switch,
and wherein one of the following conditions is satisfied:
(1a) the evaluation circuit is configured to store a dynamic threshold voltage based on the capacitive sensor signal when the optical sensor signal exceeds a predetermined threshold value, and to generate the correlated output signal when the capacitive sensor signal exceeds the dynamic threshold voltage; and
(1b) the evaluation circuit is configured to store the dynamic threshold voltage based on the optical sensor signal when the capacitive sensor signal exceeds a predetermined threshold value, and to generate the correlated output signal when the optical sensor signal exceeds the dynamic threshold voltage.

2. A sensor switch according to claim 1, wherein the at least one sensor electrode is planar and the at least one photosensor is located in the area of the at least one sensor electrode.

3. A sensor switch according to claim 2, further comprising at least one light-emitting diode (LED) that is configured to operate in at least one of the following modes: signaling a switch state, illuminating the sensor switch, and providing light for the at least one photosensor.

4. A sensor switch according to claim 2, wherein the at least one photosensor comprises at least one of a photodiode, a phototransistor, and an integrated circuit.

5. A sensor switch according to claim 4, further comprising at least one light-emitting diode (LED) that is configured to operate in at least one of the following modes: signaling a switch state, illuminating the switch, and providing light for the at least one photosensor.

6. A sensor switch according to claim 1, further comprising at least one light-emitting diode (LED) that is configured to operate in at least one of the following modes: signaling a switch state, illuminating the switch, and providing light for the at least one photosensor.

7. A method for detecting an object that is at least partially opaque to light and that is on a surface of a capacitive sensor, the method comprising:
detecting light incoming to the surface of the capacitive sensor of the sensor switch according to claim 1 to generate the optical sensor signal, and
correlating the optical sensor signal with the capacitor sensor signal.

8. A method for detecting an object that is at least partially opaque to light and that is on a surface of a capacitive sensor, the method comprising:
detecting light incoming to the surface of the capacitive sensor of the sensor switch according to claim 2 to generate the optical sensor signal, and
correlating the optical sensor signal with the capacitor sensor signal.

9. A method for detecting an object that is at least partially opaque to light and that is on a surface of a capacitive sensor, the method comprising:
detecting light incoming to the surface of the capacitive sensor of the sensor switch according to claim 3 to generate the optical sensor signal, and
correlating the optical sensor signal with the capacitor sensor signal.

10. A method for detecting an object that is at least partially opaque to light and that is on a surface of a capacitive sensor, the method comprising:
detecting light incoming to the surface of the capacitive sensor of the sensor switch according to claim 4 to generate the optical sensor signal, and
correlating the optical sensor signal with the capacitor sensor signal.

11. A method for detecting an object that is at least partially opaque to light and that is on a surface of a capacitive sensor, the method comprising:
detecting light incoming to the surface of the capacitive sensor of the sensor switch according to claim 5 to generate the optical sensor signal, and
correlating the optical sensor signal with the capacitor sensor signal.

12. A method for detecting an object that is at least partially opaque to light and that is on a surface of a capacitive sensor, the method comprising:
detecting light incoming to the surface of the capacitive sensor of the sensor switch according to claim 6 to generate the optical sensor signal, and
correlating the optical sensor signal with the capacitor sensor signal.

13. A method for detecting an object that is at least partially opaque to light and that is on a surface of a capacitive sensor of a sensor switch, the method comprising:
detecting light incoming to the surface of the capacitive sensor of the sensor switch to generate an optical sensor signal,
wherein the sensor switch comprises at least one sensor electrode, at least one photosensor, and an evaluation circuit connected to both the at least one sensor electrode and the at least one photosensor,
wherein the evaluation circuit is configured to:
generate a capacitive sensor signal indicative of an electrically-conductive object being present in a proximity of the sensor switch,
generate the optical sensor signal indicative of the object being present in the proximity of the sensor switch,
generate a correlated output signal from the capacitive sensor signal and the optical sensor signal, the correlated output signal representing that an electrically-conductive object that is at least partially opaque to light is in the proximity of the sensor switch, and wherein one of the following conditions is satisfied:
(13a) the evaluation circuit is configured to store a dynamic threshold voltage based on the capacitive sensor signal when the optical sensor signal exceeds a predetermined threshold value, and to generate the correlated output signal when the capacitive sensor signal exceeds the dynamic threshold voltage; and
(13b) the evaluation circuit is configured to store the dynamic threshold voltage based on the optical sensor signal when the capacitive sensor signal exceeds a predetermined threshold value, and to generate the correlated output signal when the optical sensor signal exceeds the dynamic threshold voltage;

and correlating the optical sensor signal with the capacitor sensor signal.

14. A method for detecting an object that is at least partially opaque to light and that is on a surface of a capacitive sensor of a sensor switch, the method comprising:
detecting light incoming to the surface of the capacitive sensor of the sensor switch to generate an optical sensor signal,
wherein the sensor switch comprises at least one sensor electrode, at least one photosensor, and an evaluation circuit connected to both the at least one sensor electrode and the at least one photosensor,
wherein the evaluation circuit is configured to:
generate a capacitive sensor signal indicative of an electrically-conductive object being present in a proximity of the sensor switch,
generate the optical sensor signal indicative of the object being present in the proximity of the sensor switch,
generate a correlated output signal from the capacitive sensor signal and the optical sensor signal, the correlated output signal representing that an electrically-conductive object that is at least partially opaque to light is in the proximity of the sensor switch, wherein one of the following conditions is satisfied:
(14a) the evaluation circuit is configured to store a dynamic threshold voltage based on the capacitive sensor signal when the optical sensor signal exceeds a predetermined threshold value, and to generate the correlated output signal when the capacitive sensor signal exceeds the dynamic threshold voltage; and
(14b) the evaluation circuit is configured to store the dynamic threshold voltage based on the optical sensor signal when the capacitive sensor signal exceeds a predetermined threshold value, and to generate the correlated output signal when the optical sensor signal exceeds the dynamic threshold voltage;

and wherein the at least one sensor electrode is planar and the at least one photosensor is located in the area of the at least one sensor electrode;

and correlating the optical sensor signal with the capacitor sensor signal.

\* \* \* \* \*